United States Patent
Yun

(10) Patent No.: US 9,644,832 B2
(45) Date of Patent: May 9, 2017

(54) LIGHTING DEVICE

(71) Applicant: Seoul Semiconductor Co., Ltd., Ansan-si (KR)

(72) Inventor: Mi Ra Yun, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 104 days.

(21) Appl. No.: 13/951,800

(22) Filed: Jul. 26, 2013

(65) Prior Publication Data

US 2015/0029715 A1    Jan. 29, 2015

(30) Foreign Application Priority Data

Jul. 23, 2013    (KR) ........................ 10-2013-0086735

(51) Int. Cl.
| | |
|---|---|
| *F21V 21/00* | (2006.01) |
| *F21V 7/00* | (2006.01) |
| *F21V 29/83* | (2015.01) |
| *F21S 8/04* | (2006.01) |
| *F21V 23/00* | (2015.01) |
| *F21W 131/40* | (2006.01) |
| *H05K 1/02* | (2006.01) |
| *F21Y 101/00* | (2016.01) |
| *F21Y 105/10* | (2016.01) |
| *F21Y 115/10* | (2016.01) |

(52) U.S. Cl.
CPC .............. *F21V 29/83* (2015.01); *F21S 8/04* (2013.01); *F21V 7/005* (2013.01); *F21V 23/005* (2013.01); *F21W 2131/40* (2013.01); *F21Y 2101/00* (2013.01); *F21Y 2105/10* (2016.08); *F21Y 2115/10* (2016.08); *H05K 1/0209* (2013.01); *H05K 2201/09063* (2013.01); *H05K 2201/10106* (2013.01)

(58) Field of Classification Search
CPC ........................... F21V 7/005; F21W 2131/40
USPC ........................................................ 362/225
See application file for complete search history.

(56) References Cited

U.S. PATENT DOCUMENTS

| | | | |
|---|---|---|---|
| 2010/0027266 A1* | 2/2010 | Tsai et al. ...................... | 362/267 |
| 2010/0177532 A1* | 7/2010 | Simon .............. | B29D 11/00278 |
| | | | 362/555 |
| 2011/0058358 A1* | 3/2011 | Soo et al. ...................... | 362/147 |
| 2012/0113621 A1* | 5/2012 | Lee .......................... | H01L 33/54 |
| | | | 362/97.1 |

\* cited by examiner

*Primary Examiner* — Nimeshkumar Patel
*Assistant Examiner* — Jacob R Stern
(74) *Attorney, Agent, or Firm* — H.C. Park & Associates, PLC

(57) ABSTRACT

Disclosed is a lighting apparatus that can be provided in a warehouse and driven by using an industrial power source and has superior light efficiency and long life span.

The disclosed lighting apparatus is provided in a warehouse and driven by an industrial power source, and comprises a main body having a plurality of concave portions and a plurality of convex portions; and a plurality of light emitting modules disposed in the concave portions of the main body, thereby having low power consumption and long life span.

22 Claims, 5 Drawing Sheets

LIGHTING DEVICE

This application claims priority from and the benefit of Korean Patent Application No. 10-2013-0086735, filed on Jul. 23, 2013, which is hereby incorporated by reference for all purposes as if fully set forth herein.

FIELD OF THE INVENTION

The present invention relates to a lighting apparatus, and more particularly, to a lighting apparatus to be provided in a warehouse.

DESCRIPTION OF THE RELATED ART

A conventional lighting apparatus has been provided in a display apparatus or variously used to provide light at home or in an industrial warehouse.

The conventional lighting apparatus employs a lamp and particularly includes an electric transformer or the like which may allow the lamp to be driven by an alternating current (AC) voltage at home or in the industrial warehouse.

The lamp has disadvantages of short life span and high power consumption.

Recently, a lighting apparatus that utilizes a light emitting device as a light source has been suggested.

However, such a lighting apparatus including a conventional light emitting device has a problem in that the lighting apparatus requires an electric transformer for allowing the lighting apparatus to be driven by means of an AC power source, resulting in a more complicated driver circuit in the lighting apparatus. In particular, a lighting apparatus for use in an industrial warehouse or the like should be able to provide a sufficient quantity of light to a location at a lighting distance of 2 meters or more, although the lighting apparatus including the conventional light emitting device has a problem in that it is difficult to provide entirely uniform and high luminance to a location at a lighting distance of 2 meters or more.

DESCRIPTION OF THE INVENTION

Technical Purpose of the Invention

An object of the present invention is to provide a lighting apparatus that can be provided in a warehouse and driven by using an industrial power source and has superior light efficiency and long life span.

Solution of the Invention

A lighting apparatus according to an embodiment of the present invention is provided in a warehouse and driven by an industrial power source, and includes a main body having a plurality of concave portions and a plurality of convex portions; and a plurality of light emitting modules disposed in the concave portions of the main body, thereby having low power consumption and long life span.

The plurality of concave portions may be disposed alternately with the plurality of convex portions.

The lighting apparatus may further include side covers disposed on both sides of the main body, and the side covers may cover both ends of each of the light emitting modules.

The concave and convex portions comprise Al, Ag, Cu, Au, Mg, or an alloy comprising at least one thereof.

The lighting apparatus may further include guide members disposed between the light emitting modules.

Each of the guide members may include a flat portion; and inclined portions extending from both sides of the flat surface, wherein the flat portion may be placed over each of the convex portions.

Each of the light emitting modules is disposed between guide members and exposed to the outside from the inclined portions of the guide members.

The guide members comprise Al, Ag, Cu, Au, Mg, or an alloy comprising at least one thereof.

The light emitting modules may include a first light emitting module having an antistatic device and a first driver IC; and a second light emitting module connected to the first light emitting module and comprising a second driver IC.

Each of the first and second light emitting modules may include a substrate having receiving grooves on both sides of the substrate; a plurality of light emitting devices mounted on the substrate; and connection terminals for electrically connecting the first and second light emitting modules to each other, wherein the receiving grooves are formed at a fixed interval along the both sides of the substrate.

The main body may have protrusions corresponding to the receiving grooves.

The substrate may further include a plurality of heat-dissipating holes formed around anode terminals of the light emitting devices.

The light emitting modules may be driven by the industrial power source of 270V or more.

A lighting apparatus according to another embodiment of the present invention includes a main body having a plurality of concave portions, a plurality of convex portions, and first inclined portions for connecting the concave and convex portions to each other; light emitting modules disposed in the concave portions; and guide members disposed on the convex portions, wherein the light emitting modules comprise first and second light emitting modules, and the first and second light emitting modules are connected to each other by connection terminals, thereby having low power consumption and long life span.

Each of the guide members may include a flat portion; and second inclined portions extending from both sides of the flat portion, wherein the flat portion is disposed the convex portions.

Each of the light emitting modules may be disposed between guide members and exposed to the outside from the second inclined portions of the guide members.

The first light emitting module may include an antistatic device and a first driver IC, and the second light emitting module may include a second driver IC.

Effect of the Invention

According to the embodiments of the present invention, the lighting apparatus can be used in an industrial warehouse by means of the configuration in which the light emitting modules can be driven by a high AC voltage of 270V or more and the guide members can concentrate light, which is emitted from the light emitting modules, directly downward.

Furthermore, the lighting apparatus of the present invention has an advantage in that the light emitting devices provided in the lighting apparatus have lower power consumption and longer life span than those of a conventional lamp and thus the lighting apparatus may be more economic than the lamp.

DESCRIPTION OF THE PREFERRED EMBODIMENT

Figure 1:
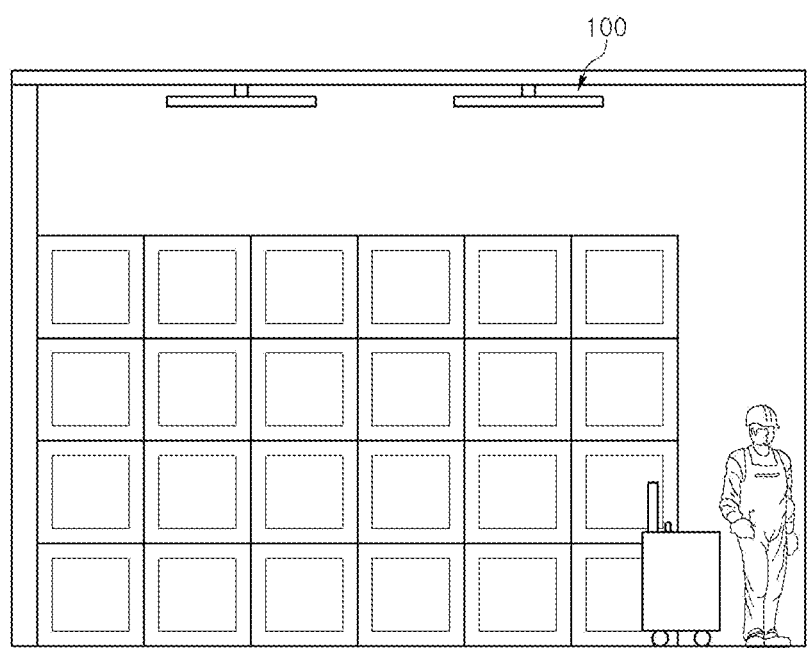
FIG. 1 is a view showing a warehouse having a lighting apparatus according to the present invention.

Hereinafter, a preferred embodiment of the present invention will be described in detail with reference to the accompanying drawings. The following embodiment is provided only for illustrative purposes so that those skilled in the art can fully understand the spirit of the present invention. Therefore, the present invention is not limited to the following embodiment but may be implemented in other forms. In the drawings, the widths, lengths, thicknesses and the like of elements are exaggerated for convenience of illustration. Like reference numerals indicate like elements throughout the specification and drawings. Modifications of elements in the present invention to the extent that they do not depart from the scope or spirit of the present invention do not include limitative meanings and should be construed as clearly representing the scope or spirit of the present invention that should be defined only by the appended claims.

Hereinafter, a preferred embodiment of the present invention will be described in detail with reference to the accompanying drawings so that a person skilled in the art to which the present invention pertains can easily implement the present invention.

Figure 2:
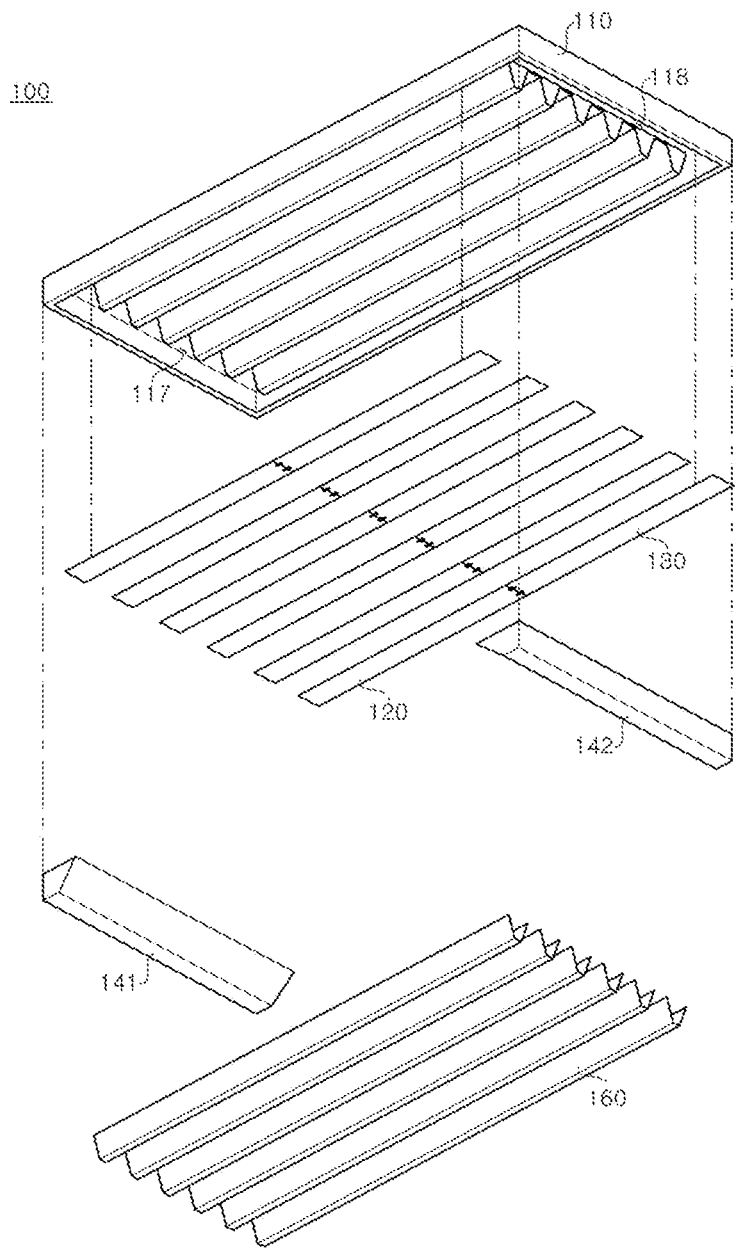
FIG. 2 is an exploded perspective view showing a lighting apparatus according to an embodiment of the present invention.

FIG. 1 is a view showing a warehouse having a lighting apparatus according to the present invention, and FIG. 2 is an exploded perspective view showing a lighting apparatus according to an embodiment of the present invention.

As shown in FIGS. 1 and 2, the lighting apparatus 100 of the present invention is used for an industrial purpose which typically requires a longer lighting distance than that of a household purpose. For example, the lighting apparatus 100 may be installed in an industrial warehouse 10.

The lighting apparatus 100 is installed in the warehouse 10 whose height is 2 meters or more. That is, the lighting apparatus 100 is configured to be a direct type lighting apparatus that may provide light to a location at a lighting distance of 2 meters or more.

The lighting apparatus 100 has a configuration in which light is concentrated directly downward from the installed position thereof. For example, if the lighting apparatus 100 is disposed on the ceiling of the warehouse 10, the lighting apparatus 100 is installed such that a plurality of first light emitting modules 120 and a plurality of second light emitting modules 130 thereof emit light directly downward. The lighting apparatus 100 includes a main body 110 having a plurality of concave portions and a plurality of convex portions; the plurality of first light emitting modules 120 and the plurality of second light emitting modules 130 provided in the concave portions; a plurality of guide members 160 provided over the convex portions; and first and second side covers 141 and 142 for covering both end edges of each of the first and second light emitting modules 120 and 130. The main body 110 has first and second areas 117 and 118 at both end edges of the main body 110 where the concave and convex portions are omitted.

The lighting apparatus 100 can be driven by a high alternating current (AC) voltage of 270V or more, for example 277V, for an industrial use. Further, the first and second light emitting modules 120 and 130 can include AC driver circuits, thereby enabling elimination of a separate converter.

The detailed configurations of the lighting apparatus 100 will be described in more detail with reference to FIGS. 3 to 6.

Figure 3:
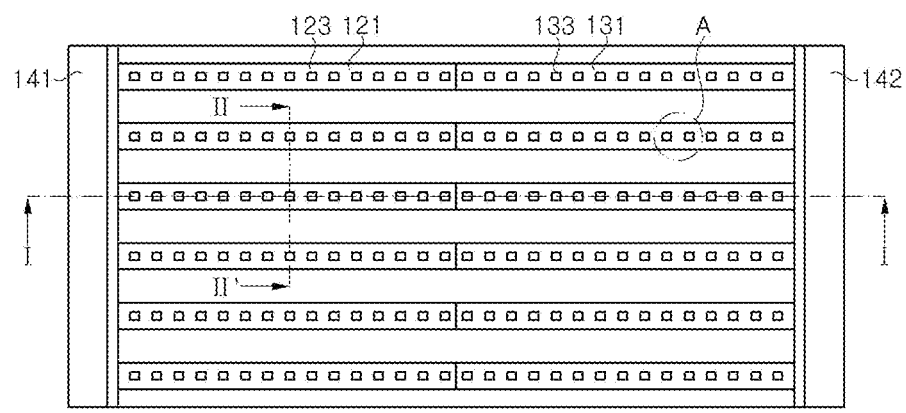
FIG. 3 is a plan view showing the lighting apparatus according to the embodiment of the present invention.
Figure 4:
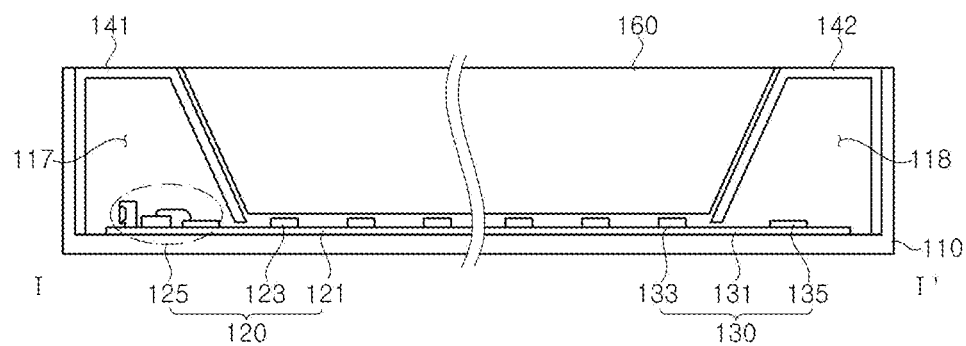
FIG. 4 is a sectional view of the lighting apparatus, taken along line I-I' in FIG. 3.

FIG. 3 is a plan view showing the lighting apparatus according to the embodiment of the present invention, and FIG. 4 is a sectional view of the lighting apparatus, taken along line I-I' in FIG. 3.

Figure 5:
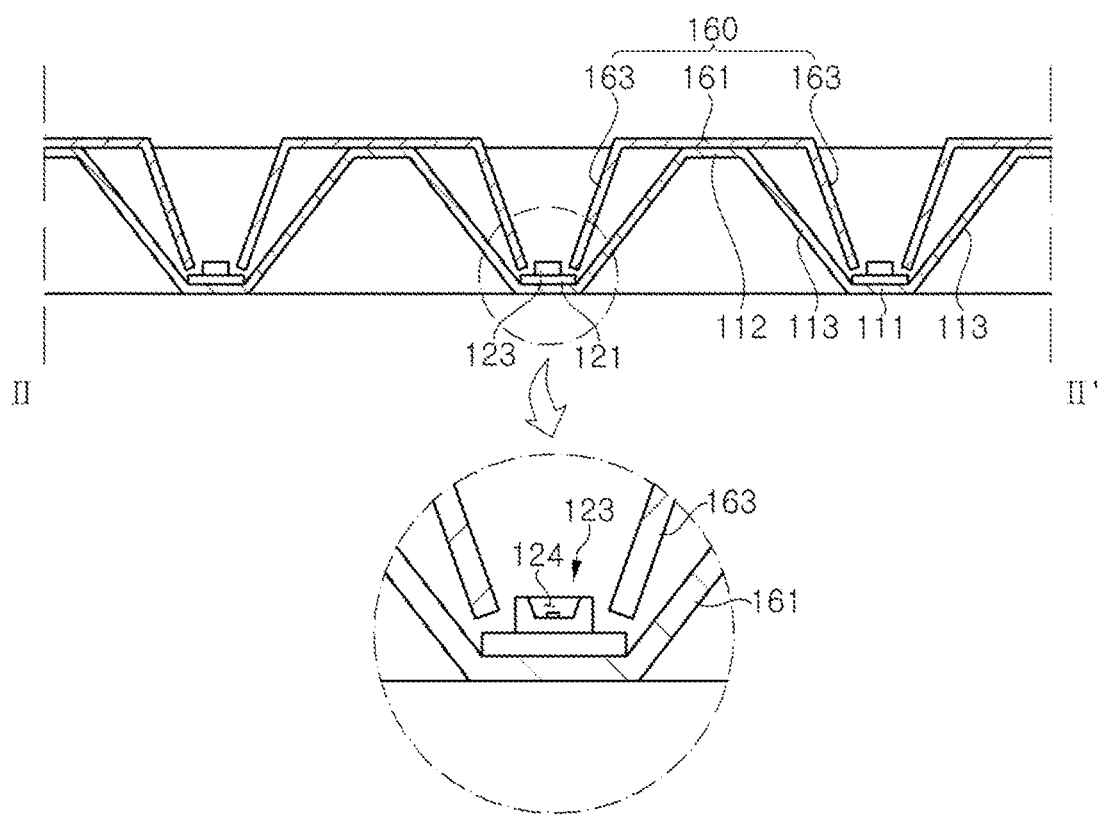
FIG. 5 is a sectional view of the lighting apparatus, taken along line II-II' in FIG. 3.
Figure 6:
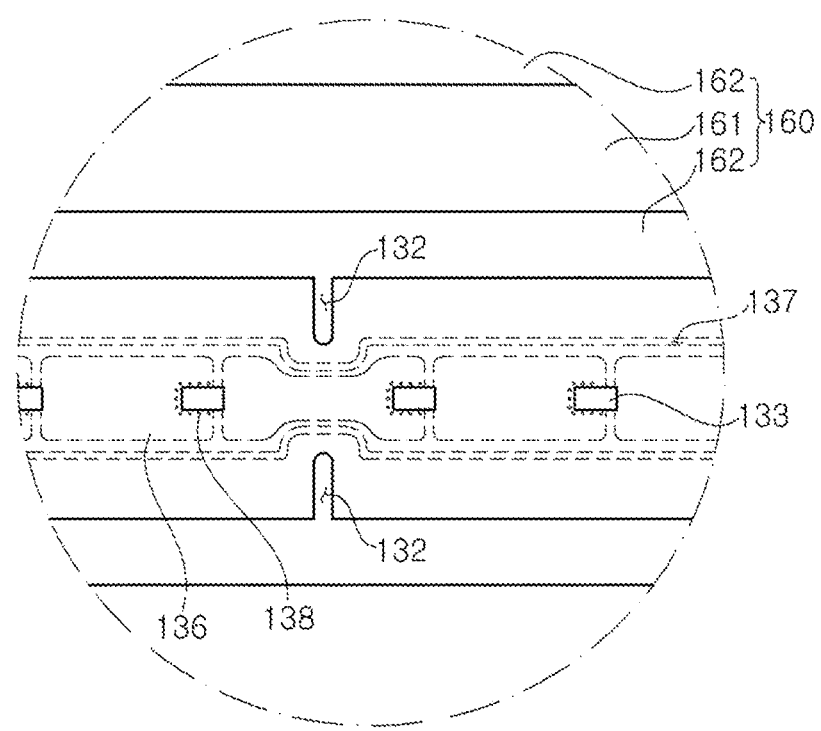
FIG. 6 is a detailed view showing an area indicated by A in FIG. 3.

FIG. 5 is a sectional view of the lighting apparatus, taken along line II-II' in FIG. 3, and FIG. 6 is a detailed view showing an area indicated by A in FIG. 3.

As shown in FIGS. 2 to 6, the lighting apparatus 100 of the present invention includes the main body 110, the plurality of first light emitting modules 120, the plurality of second light emitting modules 130, the first side cover 141, the second side cover 142, and the plurality of guide members 160.

The main body 110 has the plurality of concave portions 111 and the plurality of convex portions 112, and the concave and convex portions 111 and 112 are alternated in a first direction. The concave and convex portions 111 and 112 may be made of a material having superior thermal conductivity. For example, the concave and convex portions 111 and 112 may be made of Al, Ag, Cu, Au, Mg, or an alloy comprising at least one thereof.

First inclined portions 113 are located between the concave and convex portions 111 and 112. The first inclined portions 113 connect the concave and convex portions 111 and 112 to each other. The first inclined portions 113 extend from both sides of each of the concave portions 111, and define slant angles that are symmetric to each other at the both sides of each of the concave portions 111. Further, the first inclined portions 113 extend from both sides of each of the convex portions 112, and define slant angles that are symmetric to each other at the both sides of each of the convex portions 112.

The main body 110 has the first and second areas 117 and 118 at both side edges of the main body 110. The first and second areas 117 and 118 are defined as areas where the concave and convex portions 111 and 112 are omitted. The first and second areas 117 and 118 correspond to non-light emitting areas of the first and second light emitting modules 120 and 130. The non-light emitting areas may be defined as areas where first and second driver circuits 125 and 135 are disposed.

The first and second side covers 141 and 142 cover the first and second areas 117 and 118, respectively.

The plurality of first light emitting modules 120 and the plurality of second light emitting modules 130 are disposed in the concave portions 111 such that one of the first light emitting modules 120 and a respective one of the second light emitting modules 130, which are connected to each other, are provided in a respective one of the concave portions 11.

Each of the first light emitting modules 120 includes a first substrate 121, a plurality of first light emitting devices 123, and the first driver circuit 125.

The plurality of first light emitting devices 123 are mounted on the first substrate 121 at a predetermined interval.

The first driver circuit 125 is positioned at one side edge of the first substrate 121, and has an over-voltage protecting device and a driver integrated circuit (IC).

Connection terminals (not shown) that are connected to the second light emitting modules 130 are provided at the other side edge of the first substrate 121.

Each of the second light emitting modules 130 includes a second substrate 131, a plurality of second light emitting devices 133, and the second driver circuit 135.

The plurality of second light emitting devices 133 are mounted on the second substrate 131 at a predetermined interval.

The second driver circuit 135 is disposed at one side edge of the second substrate 131, and has a driver IC.

Connection terminals (not shown) that are connected to the first light emitting modules 120 are provided at the other side edge of the second substrate 131.

Although not shown in detail in the figures, each of the first and second light emitting devices 123 and 133 may include a plurality of light emitting cells. That is, in the first and second light emitting devices 123 and 133, the plurality of light emitting cells are connected to one another in serial or in parallel. Moreover, each of the first and second light emitting devices 123 and 133 may further include an AC driver controller required to perform an AC driving operation. For example, each of the first and second light emitting devices 123 and 133 may include a rectifying bridge portion for allowing an electric current to selectively flow according to a forward or reverse voltage, and may further include an RC circuit for reducing a ripple component.

Each of the first and second substrates 121 and 131 has at least one receiving groove 132 on both sides thereof with respect to a direction along which the first and second light emitting devices 123 and 133 are mounted. The receiving groove 132 functions to align the first and second substrates 121 and 131 with the concave portions 111. Accordingly, although not shown in the figures, protrusions to be received in the receiving grooves 132 may be formed in the concave portions 111.

In addition, the receiving grooves 132 serve to define the design of wiring patterns 137 formed on the first and second substrates 121 and 131 so as to improve electrical properties. Specifically, the first and second substrates 121 and 131 are provided with the wiring patterns 137 for applying driving signals to the first and second light emitting devices 123 and 133. Parasite capacitance may be formed due to a difference in voltage level between the wiring patterns 137 designed in parallel. It is easier to form the capacitance on the protrusions made of a metal, which are placed around the receiving grooves 132, than between the wiring patterns 137, due to the difference in voltage level between the wiring patterns 137, resulting in improved electrical properties of the first and second light emitting modules 120 and 130.

Further, the receiving grooves 132 have an advantageous function for heat-dissipating efficiency by increasing areas to be exposed to the outside of the first and second substrates 121 and 131. The receiving grooves 132 may be formed at positions spaced far away from the areas where the first and second light emitting devices 123 and 133 are placed. For example, the receiving grooves 132 may be placed in intermediate areas between neighboring first light emitting devices 123.

Each of the first and second substrates 121 and 131 further includes a plurality of heat-dissipating holes 138 for improving the heat-dissipating efficiency. The heat-dissipating holes 138 may be formed around edges of the first and second light emitting devices 123 and 133. That is, the heat-dissipating holes 138 may be spaced by a predetermined distance from the first and second light emitting devices 123 and 133. The heat-dissipating holes 138 penetrate the first and second substrates 121 and 131 so as to increase the areas to be exposed to the outside of the first and second substrates 121 and 131. The heat-dissipating holes 138 penetrate lead patterns 136 included in the first and second substrates 121 and 131. The heat-dissipating holes 138 are locally formed around the first and second light emitting devices 123 and 133 from which heat is generated. For example, the heat-dissipating holes 138 may be restrictedly formed around anode terminals of the first and second light emitting devices 123 and 133. The receiving grooves 132 are formed at positions spaced apart from the heat-dissipating holes 138. That is, the present invention can maximize the heat-dissipating efficiency by means of the receiving grooves 132 and the heat-dissipating holes 138.

The guide members 160 guide light, which is emitted from the first and second light emitting devices 123 and 133, directly downward. Each of the guide members 160 includes a flat portion 161 and second inclined portions 163. The flat portion 161 is positioned over one of the convex portions 112 and then coupled thereto by a separate coupling member (not shown).

The second inclined portions 163 extend from both sides of the flat portion 161, and have slant angles that are symmetric to each other at the both sides of the flat portion 161.

Distal ends of the second inclined portions 163 extend to outer surfaces of the first and second light emitting devices 123 and 133 having cavities 124. Moreover, the distal ends of the second inclined portions 163 may be positioned in the same horizontal plane as upper surfaces of the first and second light emitting devices 123 and 133 from which light is emitted. That is, the distal ends of the second inclined portions 163 may be positioned in the same horizontal plane as the upper surfaces of the first and second light emitting devices 123 and 133, or may extend to the outer surfaces of the first and second light emitting devices 123 and 133 while being spaced by a predetermined distance from the first and second substrates 121 and 131. The second inclined portions 163 concentrate light within angles of beam spread of the first and second light emitting devices 123 and 133, thereby increasing the quantity of light.

The guide members 160 may be made of a material having superior heat-dissipation and high reflectivity. For example, the guide members 160 may be made of Al, Ag, Cu, Au, Mg, or an alloy comprising at least one thereof.

As described above, the lighting apparatus 100 according to the embodiment of the present invention can be used in an industrial warehouse by means of the configuration in which the first and second light emitting modules 120 and 130 can be driven by a high AC voltage of 270V or more and the guide members 160 can concentrate the light, which is emitted from the first and second light emitting modules 120 and 130, directly downward.

Furthermore, the lighting apparatus 100 has an advantage in that the first and second light emitting devices 123 and 133 provided in the lighting apparatus 100 have lower power consumption and longer life span than those of a conventional lamp and thus the lighting apparatus 100 may be more economic than the lamp.

Although the present invention has been described in connection with the embodiment and features, the present

| [Description of References] |
| --- |
| 100: lighting apparatus |
| 110: main body |
| 111: concave portions |
| 112: convex portions |
| 113: the first inclined portions |
| 120: the first light emitting module |
| 130: the second light emitting module |
| 160: guide members |

What is claimed is:

1. A lighting apparatus provided in a warehouse and driven by an industrial power source, the lighting apparatus comprising:
    a main body comprising a plurality of concave portions and a plurality of convex portions;
    a plurality of light emitting modules disposed on the concave portions of the main body; and
    guide members respectively disposed between each of the plurality of light emitting modules,
    wherein each of the guide members comprises:
        a flat portion; and
        inclined portions extending from opposite sides of the flat portion,
            wherein the flat portion is disposed on and overlaps one of the plurality of convex portions of the main body.

2. The lighting apparatus of claim 1, wherein the plurality of concave portions are disposed alternately with the plurality of convex portions.

3. The lighting apparatus of claim 1, further comprising side covers disposed on both sides of the main body, wherein the side covers cover both ends of each of the light emitting modules.

4. The lighting apparatus of claim 1, wherein the concave and convex portions comprise Al, Ag, Cu, Au, Mg, or an alloy comprising at least one thereof.

5. The lighting apparatus of claim 1, wherein each of the light emitting modules is disposed between the guide members and exposed to the outside from the inclined portions of the guide members.

6. The lighting apparatus of claim 1, wherein the guide members comprise Al, Ag, Cu, Au, Mg, or an alloy comprising at least one thereof.

7. The lighting apparatus of claim 1, wherein the light emitting modules comprise:
    a first light emitting module comprising an antistatic device and a first driver IC; and
    a second light emitting module connected to the first light emitting module and comprising a second driver IC.

8. The lighting apparatus of claim 1, wherein each of the light emitting modules comprises:
    a substrate having receiving grooves on both sides of the substrate;
    a plurality of light emitting devices mounted on the substrate; and
    connection terminals for electrically connecting the first and second light emitting modules to each other,
    wherein the receiving grooves are formed at a fixed interval along the both sides of the substrate.

9. The lighting apparatus of claim 8, wherein the main body comprises protrusions corresponding to the receiving grooves.

10. The lighting apparatus of claim 8, wherein the substrate further comprises a plurality of heat-dissipating holes formed around anode terminals of the light emitting devices.

11. The lighting apparatus of claim 1, wherein the light emitting modules are driven by an industrial power source of 270V or more.

12. A lighting apparatus comprising:
    a main body comprising a plurality of concave portions, a plurality of convex portions, and first inclined portions for connecting the concave and convex portions to each other;
    light emitting modules disposed on the plurality of concave portions; and
    guide members respectively disposed between the concave portions of the main body,
    wherein the light emitting modules comprise first and second light emitting modules, and the first and second light emitting modules are connected to each other by connection terminals, and
    wherein each of the guide members comprises:
        a flat portion; and
        second inclined portions extending from opposite sides of the flat portion,
            wherein the flat portion is disposed on and overlaps one of the plurality of convex portions of the main body.

13. The lighting apparatus of claim 12, wherein the plurality of concave portions are disposed alternately with the plurality of convex portions.

14. The lighting apparatus of claim 12, further comprising side covers disposed on both sides of the main body, wherein the side covers cover both ends of each of the light emitting modules.

15. The lighting apparatus of claim 12, wherein the concave and convex portions comprises Al, Ag, Cu, Au, Mg, or an alloy comprising at least one thereof.

16. The lighting apparatus of claim 12, wherein each of the light emitting modules is disposed between the guide members and exposed to the outside from the second inclined portions of the guide members.

17. The lighting apparatus of claim 12, wherein the guide members comprises Al, Ag, Cu, Au, Mg, or an alloy comprising at least one thereof.

18. The lighting apparatus of claim 12, wherein:
    the first light emitting module comprises an antistatic device and a first driver IC, and
    the second light emitting module comprises a second driver IC.

19. The lighting apparatus of claim 12, wherein each of the first and second light emitting modules comprises:
    a substrate having receiving grooves on both sides of the substrate;
    a plurality of light emitting devices mounted on the substrate; and
    connection terminals for electrically connecting the first and second light emitting modules to each other,
    wherein the receiving grooves are formed at a fixed interval along the both sides of the substrate.

20. The lighting apparatus of claim 19, wherein the main body comprises protrusions corresponding to the receiving grooves.

21. The lighting apparatus of claim 19, wherein the substrate further comprises a plurality of heat-dissipating holes formed around anode terminals of the light emitting devices.

22. The lighting apparatus of claim 12, wherein the light emitting modules are driven by an industrial power source of 270V or more.

\* \* \* \* \*